United States Patent
Souriau et al.

(10) Patent No.: US 8,409,971 B2
(45) Date of Patent: Apr. 2, 2013

(54) INTEGRATED MULTICOMPONENT DEVICE IN A SEMICONDUCTING DIE

(75) Inventors: Jean-Charles Souriau, Saint-Egreve (FR); Francois Baleras, Saint Georges de Commiers (FR)

(73) Assignee: Commissariat a l'Energie Atomique, Paris (FR)

(*) Notice: Subject to any disclaimer, the term of this patent is extended or adjusted under 35 U.S.C. 154(b) by 528 days.

(21) Appl. No.: 12/602,846

(22) PCT Filed: Jun. 5, 2008

(86) PCT No.: PCT/EP2008/057002
§ 371 (c)(1),
(2), (4) Date: Dec. 3, 2009

(87) PCT Pub. No.: WO2008/155231
PCT Pub. Date: Dec. 24, 2008

(65) Prior Publication Data
US 2010/0195299 A1 Aug. 5, 2010

(30) Foreign Application Priority Data
Jun. 7, 2007 (FR) .................................. 07 55575

(51) Int. Cl.
*H01L 21/00* (2006.01)
*H01L 23/495* (2006.01)
(52) U.S. Cl. .................. 438/464; 438/108; 257/668
(58) Field of Classification Search .................. 438/108, 438/464; 257/668
See application file for complete search history.

(56) References Cited

U.S. PATENT DOCUMENTS

| | | | |
|---|---|---|---|
| 4,322,980 A | 4/1982 | Suzuki et al. | |
| 4,958,216 A | 9/1990 | Tanaka et al. | |
| 5,353,195 A | 10/1994 | Fillion et al. | |
| 5,353,498 A | 10/1994 | Fillion et al. | |
| 5,497,033 A | 3/1996 | Fillion et al. | |
| 5,904,502 A | 5/1999 | Ference | |
| 5,909,052 A | 6/1999 | Ohta et al. | |
| 6,154,366 A | 11/2000 | Ma et al. | |
| 6,998,533 B2 | 2/2006 | De Samber et al. | |
| 7,202,107 B2 | 4/2007 | Fuergut et al. | |
| 7,442,581 B2 * | 10/2008 | Lytle et al. ................. | 438/118 |

(Continued)

FOREIGN PATENT DOCUMENTS

| | | |
|---|---|---|
| DE | 199 07 295 C1 | 2/2001 |
| EP | 0 154 431 A1 | 9/1985 |

(Continued)

OTHER PUBLICATIONS

Rama Puligadda, et al., "High-Performance Temporary Adhesives for Wafer Bonding Applications", Mater. Res. Soc. Symp. Proc vol. 970, Materials Research Society, XP-002495201, 2007, 11 pages.

(Continued)

*Primary Examiner* — James Mitchell
(74) *Attorney, Agent, or Firm* — Oblon, Spivak, McClelland, Maier & Neustadt, L.L.P.

(57) ABSTRACT

An electronic device with integrated discrete components, including a wafer including cavities that can receive the components, an active face of the components being in a same plane as a face of the receiving wafer, and a material for laterally coating the components in the cavities.

18 Claims, 6 Drawing Sheets

U.S. PATENT DOCUMENTS

| | | | |
|---|---|---|---|
| 7,655,501 B2 * | 2/2010 | Yang et al. | 438/106 |
| 2004/0014258 A1 | 1/2004 | Nakamura | |
| 2005/0215030 A1 | 9/2005 | Yamamoto | |
| 2006/0051895 A1 | 3/2006 | Abe et al. | |
| 2006/0220222 A1 | 10/2006 | Zeng | |
| 2006/0267213 A1 | 11/2006 | Ozguz et al. | |
| 2006/0273469 A1 | 12/2006 | Beer et al. | |
| 2007/0080458 A1 | 4/2007 | Ogawa et al. | |
| 2007/0096305 A1 | 5/2007 | Fuergut et al. | |
| 2007/0108610 A1 | 5/2007 | Kondo | |
| 2007/0117369 A1 | 5/2007 | Val et al. | |
| 2007/0145555 A1 * | 6/2007 | Fuergut et al. | 257/678 |
| 2008/0142946 A1 | 6/2008 | Yang et al. | |
| 2010/0047567 A1 | 2/2010 | Souriau | |

FOREIGN PATENT DOCUMENTS

| | | |
|---|---|---|
| EP | 0 611 129 A2 | 8/1994 |
| EP | 1 596 433 A1 | 11/2005 |
| FR | 2 857 157 | 1/2005 |
| FR | 2 864 342 | 6/2005 |
| GB | 2 202 673 A | 9/1988 |
| GB | 2 224 600 A | 5/1990 |
| JP | 2004-335629 A | 11/2004 |
| JP | 2005-277037 A | 10/2005 |
| JP | 2006-270036 A | 10/2006 |
| JP | 2006-527499 A | 11/2006 |
| WO | WO00/14788 | 3/2000 |
| WO | WO 2004/112136 A1 | 12/2004 |

OTHER PUBLICATIONS

Chang-Lee Chen, et al., "Bond Wireless Multichip Packaging Technology for High-Speed Circuits", IEEE Transactions on Components, Hybrids and Manufacturing Technology, vol. 15, No. 4, Aug. 2002, pp. 451-456.

Office Action issued Jul. 24, 2012 in Japanese Patent Application No. 2010-510802 (with English-language Summary).

* cited by examiner

INTEGRATED MULTICOMPONENT DEVICE IN A SEMICONDUCTING DIE

TECHNICAL FIELD AND PRIOR ART

The field of the invention relates to the assembling of microsystems on a scale of a wafer in a semiconducting material, for example in silicon.

It notably relates to applications for which technologies are sought, commonly called "Above IC", for high density integration of passive components, of detectors or optoelectronic components or of MEMs directly on the circuits.

Presently, heterogeneous integration methods can only be accomplished on entire silicon wafers. The "Above IC" methods are therefore limited to the fields where the microsystem integrator may have wafers available, which involves significant costs (from a few hundred thousand euros to several million euros with switching to 300 mm wafers) in terms of sets of masks and of manufacturing the wafers in a foundry. In this context, it is understandable that these costs are an obstacle to the emergence of novel technologies and that the actors are very restricted.

Further, for applications such as telephony, the active surface of the integrated circuits is not sufficient for receiving thereon all the components required for the system (passive components, amplifiers, switches, SAW or BAW components). Indeed, it is necessary to assemble the different components on PCB (printed circuit) type or substrates or ceramic substrates. The architectures are often complex and the assembling and interconnection require many individual operations (placement of the components and wire cabling).

Today, the integration of microsystems is currently accomplished by transferring the components onto ceramic or PCBs with SMC type discrete passive components. The components are either stuck or soldered on the PCBs, the electrical connections being ensured by metal wires of the "wire cabling" type or by solders in the case when the pads of the chip are facing the PCB "flip chip". This last type of transfer is advantageous, because it reduces the interconnection lengths.

There exists another technique in which a wafer is reformed from discrete chips by coating them within a polymer.

This technique, in which the active face of exposed components are temporarily stuck on an adhesive and they are then coated and re-routing is accomplished over them, was published in 1992 by Chang-Lee Chen et al. in an article entitled <<Bond Wireless Multichip packaging Technology for High Speed Circuits>>, published in "IEEE Transactions On component Hybrids and Manufacturing Technology, Vol. 15 No. 4, pages 451-456."

In this type of technique, the methods described in documents U.S. Pat. No. 5,353,498 and U.S. Pat. No. 5,497,033, as well as the technique described in document FR 2 857 157 are also known. The technique described in document FR 2 864 342 applies to components which are already in a casing; it is very complex because a portion of the casing has then to be ground in order to recover the contacts of the components.

A problem posed by the implementation of these techniques is that of the curvature of the reformed wafers and of their brittleness. Such a curvature is induced during changes in temperature, by differences in the thermal expansion coefficient between the coating resin and the silicon components. A shrinkage or contraction effect of the coating resin may further occur during its hardening.

Curvatures with deflections of more of 100 µm for wafers with a diameter of 100 mm may result from this, which is too large for handling in many pieces of equipment and which may be redhibitory for certain methods, for example requiring that the wafer be pressed against a support with view to homogenous application of the method, as this is the case for annealing of the <<hot plate>> type (on a hot support).

This method therefore remains difficult to apply industrially and remains not very reliable.

Another type of method applies a frame into which the components are integrated. The assembly is adhesively bonded on a substrate.

A difficulty encountered with this type of method is that of ensuring accurate adhesive bonding of the components and of the frame, which withstands the hardening of the coating material and which is reversible.

Another method for making an integrated structure with semiconducting components is described in document U.S. Pat. No. 7,202,107. It consists of using a double face adhesive film including a permanent side and a side which loses its adhesion when it is heated. The permanent side is put into contact with a support and the components are transferred on the side with reversible adhesion.

A difficulty encountered with this method is the separation of the wafer and of its support. Indeed, this type of film is well adapted for adhesively bonding and detaching a planar and rigid surface. In the mentioned invention, the coating material is deposited or injected in the liquid state, and then is hardened. More intimate bonds are then generated with the adhesive. Withdrawal of the latter is then delicate and would advantageously require peeling, which is not possible because the adhesive bonding of the film and of the support is permanent.

DISCUSSION OF THE INVENTION

The invention first relates to an integrated electronic device with discrete components, including:
- a wafer, a so-called receiving wafer, having cavities containing said components, the active face of these components being in a same plane as a face, a so-called front face, of the receiving wafer,
- a material for laterally coating the components in the cavity,
- an adhesive layer in a double face thermosensitive material, onto which are attached the front face of the receiving wafer and the active faces of the components.

It also relates to a method for integrating discrete components into a wafer, a so-called receiving wafer, this wafer having cavities capable of receiving said components, a method wherein:

a) a stack is made including:
   a support,
   a double face thermosensitive adhesive layer,
   the wafer,
   and the components positioned in said cavities of the wafer so that their active face is in a same plane as a face, a so-called front face, of the receiving wafer,
   said front face being assembled with the double face thermosensitive adhesive layer, b) a material is injected for laterally coating the components in the cavities.

The invention therefore proposes an electronic device with integrated components, and a technique for integrating bare discrete components, into a receiving wafer, which allows the active face of the components to be in a plane of one face of this receiving wafer.

By using a double face thermosensitive adhesive layer, adhesion with the wafer, but also with the support, may be broken.

After step b), a step may therefore be carried out for removing the support and/or the totality or part of the double face thermosensitive adhesive layer.

The thermosensitive adhesive layer may for example be:
of the type including a PET layer covered on each side with a film of thermoexpansible or thermoadhesive material, which loses its adhesive properties when it is heated; possibly both of these films have detachment temperatures different from each other;
or of the thermal dewetting type, the separation of the support and of the front face of the wafer being obtained by sliding of the layer.

Such a method may include a preliminary step for forming an electrically insulating layer, on at least one portion of the surfaces of the wafer.

Step a) may include a preliminary assembly of the adhesive layer with the wafer, and then an assembly of the support with the adhesive layer, the components being positioned on this same adhesive layer before or after assembling the wafer with the adhesive layer.

Alternatively, this step includes a preliminary assembly of the adhesive layer with the support, and then assembly of the wafer with the adhesive layer, the components being positioned on the adhesive before or after the assembly of the wafer with the adhesive layer.

The material of the wafer and the coating material may have properties with which problems encountered with known techniques, in particular problems of curvature of the wafers and of their fragility, may be limited or eliminated.

Thus, preferably, both in the device and in the method according to the invention:
the material of the wafer has a heat expansion coefficient comprised between 2 ppm/° C. and 7 ppm/° C.
and/or the lateral coating material has a final volume of less than 30% of the volume of the whole of the wafer.

In a method or device according to the invention, the wafer may be in a semiconducting material, for example in silicon, or in AsGa or in InP, or else of the SOI type, or in glass, for example of the borosilicate or aluminosilicate type, or in aluminium nitride or mullite.

The receiving wafer, or die, may be virgin or may have undergone treatments on either one or both of its faces beforehand, for example: passivation of the surfaces (deposit of an insulator) and/or etching and/or deposition of positioning patterns and/or the making of thin layer passive components and/or the making of conducting vias, etc. . . . .

A step for forming an insulating layer may be carried out beforehand, on at least one portion of the surfaces of the wafer.

After insertion of the components, a step for thinning the rear face of the receiving wafer may be carried out.

The cavities of the wafer into which the components may be inserted may be through-cavities.

The receiving wafer may further include one or more components and/or one or more alignment patterns.

An integrated wafer according to the invention may then be introduced in a pre- or post-process in a microelectronics or microsystem production line.

Among the examples of technological operations which may be performed on the receiving wafer, mention may be made of the integration of passive components into a thin layer, or any other method of the <<above-IC>> type, of the making of metallized "vias", the re-routing of contact pads, "micro bumping" techniques, the transfer of components.

With the invention, it is in particular possible to integrate and connect discrete components stemming from various processes (Si, SiGe, AsGa, SOI, InP) and to finalize a system, with a high level of integration, by operations which are performed collectively at the scale of one wafer.

DETAILED DISCUSSION OF EMBODIMENTS OF THE INVENTION

Figure 1A:
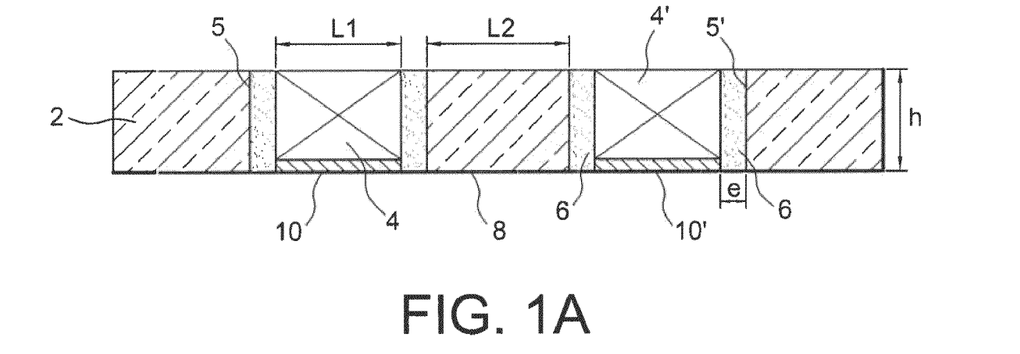
FIGS. 1A, 1B and 2 illustrate a device according to the invention.
Figure 1B:
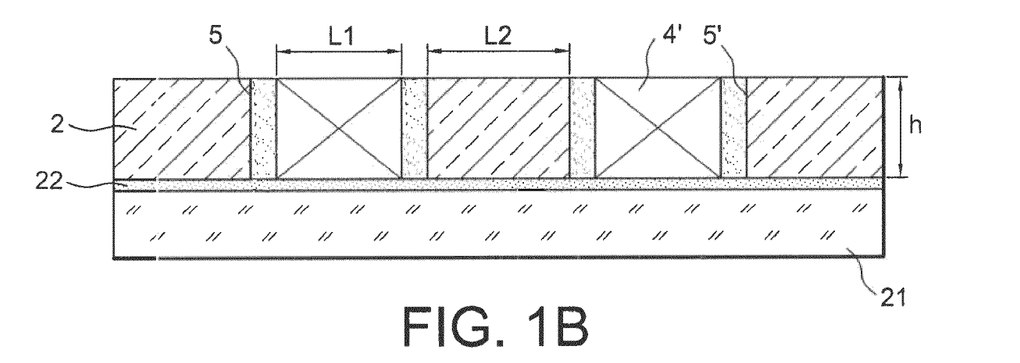

Two examples of devices which may be obtained by the invention are illustrated in a sectional view in FIGS. 1A and 1B.

Each of these two devices includes a die 2, for example in a semiconducting material, with a thickness h. One or more electronic components 4, 4' which may either be all identical or different from each other (they may notably have thicknesses different from each other), are contained in cavities 5, 5' of this die. The active faces of these components are designated by references 10, 10': these are faces on which are made elementary components defining the functionalities of each component. These active faces 10, 10' of the components are flush with the plane of the face 8, a so-called front face, of the receiving die 2. One or more of the components 4 may be semiconducting components, in particular from the field of micro-electronics, such as integrated circuits and/or MEMS sensors, and/or optical components (MOEMS) and/or bio-components and/or switches.

Two neighboring cavities 5, 5' may be separated by a distance designated by $L_2$, $L_1$ as for it designating the width of a component. The corresponding dimensions (width, distance separating two neighboring cavities) in the second direction of the plane 8 (this second direction is perpendicular to the plane of the figure) are substantially identical with $L_1$, $L_2$. These dimensions are again found in FIG. 2. Orders of magnitude for the dimensions h, $L_1$ et $L_2$ are given later on.

A coating material 6 surrounds the components and ensures the bond between their lateral surfaces and the wall of the cavities 5, 5'.

In FIG. 1B, the device which has just been described further rests on a substrate 21 provided with an adhesive layer 22, in a double face thermosensitive material. This is therefore a layer, each face of which is adhesive up to a certain temperature and loses this adhesiveness above this temperature. In other words, the substrate 21, the layer 22 and then the components and their coating 6 are successively found in this embodiment. The substrate 21 and the layer 22 may be transparent. The adhesive material layer 22 is therefore interposed between the supporting substrate on the one hand and the plane of the front face 8 of the receiving wafer 2 on the other hand. This plane and the active face of the components are attached on this adhesive material layer 22.

Figure 2:
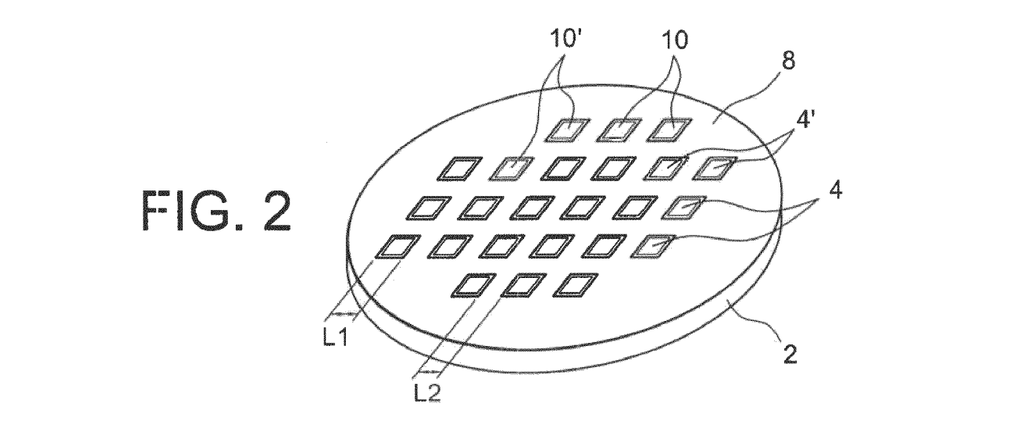

FIG. 2 illustrates a substrate consisting of the receiving die 2. In this die, are inserted a plurality of components 4, 4', the active surfaces 10, 10' of which are visible, in the plane of one face 8 of the die. The different components may have different thicknesses, and in particular different from that of the wafer 2. The face 8 may have been processed, before receiving the components 4. It may then be treated with methods of the <<above IC>> type, as explained hereinbelow.

A material of the die 2 is preferred so that its heat expansion coefficient (HEC) is identical or very close to that of the electronic component(s) 4, itself defined by the semiconducting material(s) of this (these) component(s). The HEC of the die 2 is then substantially comprised between 2 ppm/° C. and 7 ppm/° C. By selecting a wafer material 2 having an HEC in this range, the curvature problems may be strongly reduced, due in known devices to significant HEC differences between the materials of the components and that of the die.

The selection of the receiving die 2 will depend as much as possible on the nature of the components 4 to be inserted therein. Generally, the latter are in silicon, but other semiconducting materials, such as AsGa or InP, may be present.

If the components 4 are in silicon, or made from a substrate essentially in silicon, or of the SOI type, a material for which the HEC is comprised between 2 ppm/° C. and 7 ppm/° C. or even 2 ppm/° C. and 5 ppm/° C. will be preferably selected for the receiving die 2. For example, a receiving die itself in silicon will be selected.

If the components 4 are in InP or in AsGa, or made from a substrate essentially in InP or in AsGa, a material for which the HEC is comprised between 3.5 ppm/° C. and 7 ppm/° C. will be preferably selected for the receiving die 2. For example, a receiving die itself in InP or in AsGa, respectively, will be selected.

Further as an example of the receiving die material 2, mention may be made of silicon (HEC comprised between 2.5 and 4.2 ppm/° C. depending on temperature, 2.5 ppm/° C. at 20° C.), or AsGa (HEC of about 5.4 ppm/° C.), or InP (HEC of about 4.6 ppm/° C.), or borosilicate glass (HEC of about 4.5 ppm/° C.), or aluminosilicate glass (HEC of about 4.7 ppm/° C.), or aluminium nitride (HEC substantially comprised between 2.1 and 4.4 ppm/° C.), or mullite (HEC substantially comprised between 3.5 and 4.4 ppm/° C.), or ceramics (HEC close to 4 ppm/° C.). Selection of a material for which the HEC is adapted is preferably sought. Advantageously, the same material will be selected as the one used as a substrate for making the components 4.

The coating material 6 of thickness e surrounds the components 4. It ensures a bond or good adherence between the flanks or the edges of the component(s), and the flank of the corresponding cavity(ies) 5. This coating material preferably has a low heat expansion coefficient, i.e. for example comprised between 1 ppm/° C. and 10 ppm/° C. Still preferably, it has no or little constriction or contraction during its hardening.

As an example of a coating material 6, mention may be made of epoxy resin, polyurethane, elastomer, silicone materials, acrylics, methacrylates, polypropylene, or fusible glass. Each of these materials has a high HEC; for reducing it, the selected material may be mixed with silica particles.

Minimization of the volume of the coating material 6 may be sought, notably in the case of a material of the wafer 2 with an HEC close to that of the components, by adjusting the size of the cavity 5 with that of the components 4. The proportion of solid material with the same HEC as the components 4 or neighboring HECs or close to that of these components, may then be maximized in the reconstructed wafer 2. Relatively to the final wafer (including the substrate 2, the components 4 and the coating material), the assembly formed by the initial wafer (provided with its cavities 5, 5') and the components 4 is preferably a majority, for example of more than 70% or 80% by volume. The coating material 6 is then present with less than 30% or 20% by volume of the final integrated wafer.

This low proportion of coating material, possibly combined with a material of the wafer 2 having a HEC in the ranges indicated above, makes it possible to eliminate or to strongly limit the curvature problems due in known devices, to significant HEC differences between the materials of the components and that of the die.

Orders of magnitude for dimensions h, e, $L_1$ and $L_2$ may be the following:

h may be comprised between 10 μm and a few mm, for example 5 mm, e may be comprised between 20 μm and a few mm, for example 1 mm, $L_1$ may be comprised between 100 μm and a few mm, for example 5 cm, $L_2$ may be comprised between 100 μm and a few mm, for example 5 cm, These values are examples and other values are possible outside the indicated ranges.

Figure 3:
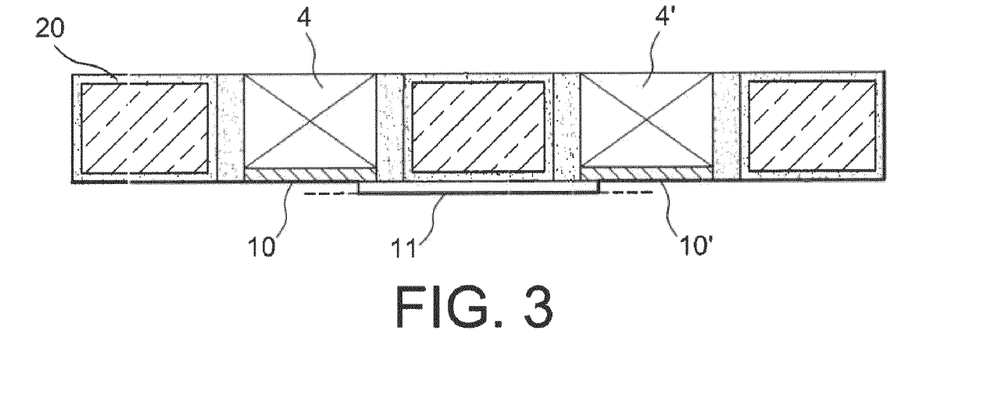
FIG. 3 illustrates a device according to the invention, with an additional insulating layer.

As illustrates in FIG. 3, which also illustrates a sectional view of an integrated device obtained by a method according to the invention, an electrically insulating layer 20 may be formed or deposited on all or part of the surfaces of the die 2, if the latter has semiconducting properties, so that the components 4 are not disturbed by these same properties. This insulating layer 20 is produced for example by thermal oxidation or by thin layer deposition (with a thickness comprised between a few nm and a few μm).

The die 2, with its components 4 and the coating material 6, may, after having been made, be subject to various treatments or processes. Mention may thus be made of various examples of <<above IC>> type processes, which may be performed on the face 8 of the wafer 2 and on the active faces 10, 10' of the components, after removing the support 21 and the layer 22, as explained later on:

integration of passive components in a thin layer (resistors and/or capacitors and/or inductors), re-routing of electric contacts and/or interconnection of the components 4, 4' between each other (for example in FIG. 3, a simple connection 11 is illustrated between the components 4; a complex set of tracks and contacts may be made at the surface of the wafer), integration on the surface 10 of the components 4, of optical components (for example micro-lenses) or interconnection pads, for example by drawing fusible beads, or transferring beads, or making "stud bumps", or growing micro-inserts, or hybridization of components on the wafer (chip on wafer).

An exemplary method for making a device according to the invention will be given, in connection with FIGS. 4A-4G.

A wafer (FIG. 4A) is selected, preferably in a material having an HEC as indicated above. For example it is in virgin silicon or it has already been treated. This wafer may include i.a., positioning patterns and/or components (for example in a thin layer) and/or conducting vias which cross the wafer.

Cavities 5 are made in this wafer (FIG. 4B) by a technique such as laser etching, KOH etching or ultrasonic machining or sanding. The receiving wafer 2 is thereby formed.

As already indicated, it may then be advantageous to passivate the exposed surfaces by thermal oxidation or by depositing an insulating material of the $SiO_2$, SiN type, etc. . . . .

Moreover, it is proceeded (FIG. 4C) with mounting of a layer 22 of double face thermosensitive material on a rigid and planar support 21. Face 8, the so-called front face of the wafer, will be transferred onto the face 22' of the layer 22 opposite to the substrate 21. A layer 22 of double face thermosensitive material has adhesive properties on both of its faces. But any one of the two faces loses its adhesive properties as soon as it is heated above a certain temperature.

The support 21 is for example another wafer, in silicon or in glass. Advantageously, this other wafer also has an HEC close to or even identical with that of the receiving die 2 and components 4 in order to ensure proper positioning of the components (by limiting the displacements and/or constraints) at the moment of the hardening of the resin (for example produced by heating to around 200° C.).

Figure 4A:
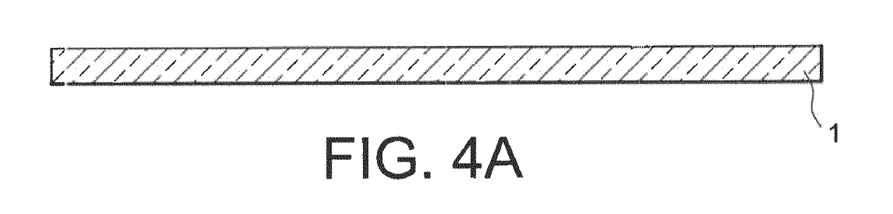
FIGS. 4A-4H are steps of an exemplary application of a method according to the invention.
Figure 4B:
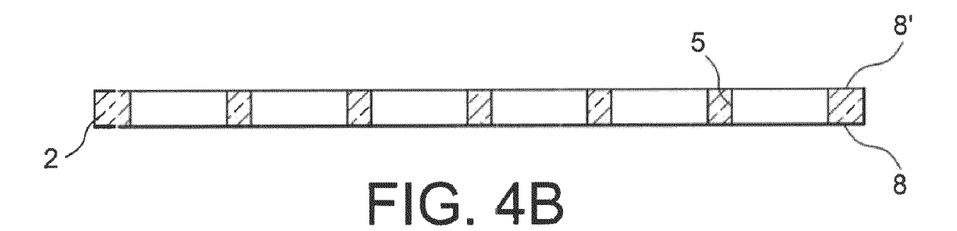
Figure 4C:
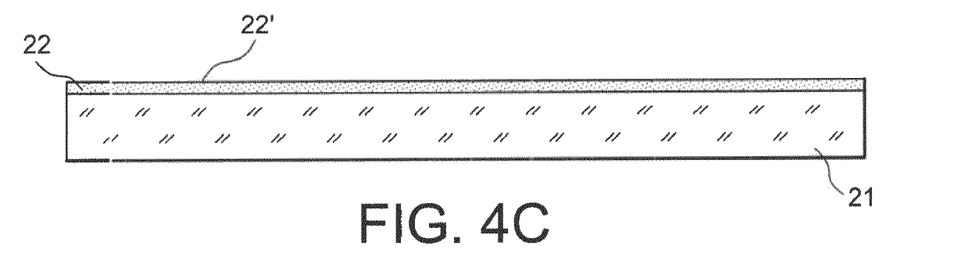
Figure 4D:
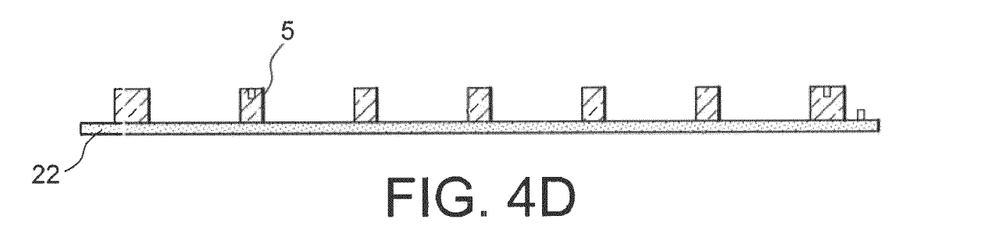

Alternatively (FIG. 4D), the layer 22 of double face thermosensitive material layer is first mounted on the front face of the wafer of FIG. 4B (a wafer provided with cavities 5), this assembly being then transferred onto the substrate 21.

Whichever the alternative (FIG. 4C or 4D) used, the assembling of the support, of the adhesive and of the wafer, leads to a structure including the wafer 2 with its cavities 5, the layer 22 and the support 21.

Figure 4E:
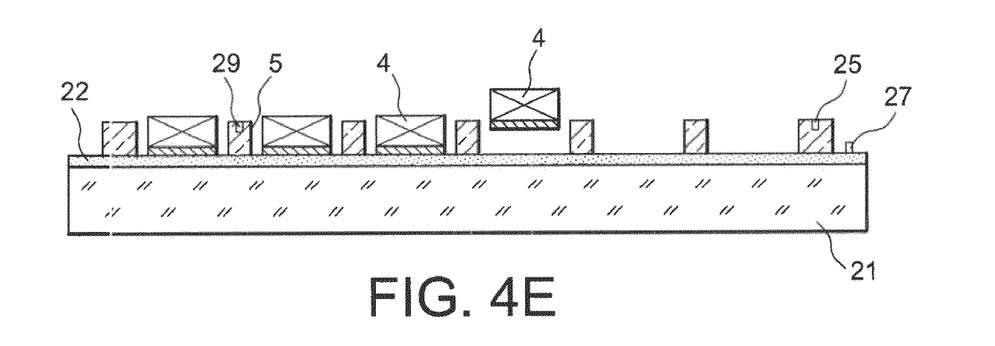
Figure 4F:
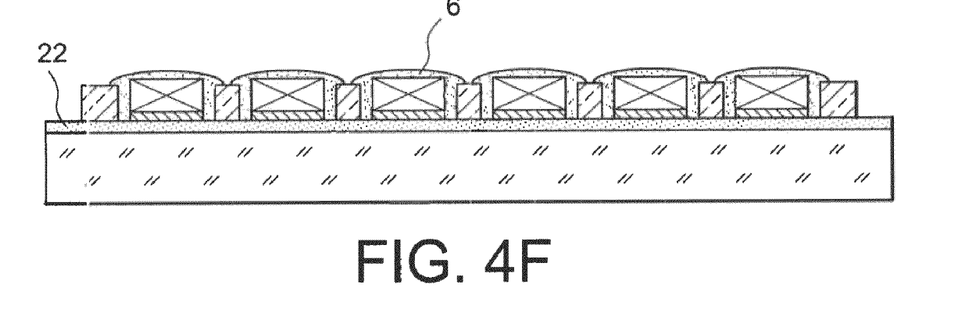

It is then proceeded with placing the components 4 in the cavities 5 (FIG. 4E).

With the equipment for placing components 4, it is possible to attain a lateral precision of the order of microns, with parallelism better than $5 \cdot 10^{-4}$ rad. These values are sufficient for recovering contacts on the connection pads of the components located on the active face (after removing the support) and which generally have a width of a few tens of μm.

The components 4 are then positioned with their active face 10 turned towards the adherence layer 22. The alignment in the cavities may be achieved by means of patterns—designated in FIG. 4E by references 25, 27, 29—which will have been produced beforehand either on the receiving wafer 2 or on the adherent layer 22.

According to an alternative of this step, the components are first positioned on the adherent layer 22, which itself rests on the substrate 21 and then the receiving die 2 is added, the cavities 5 of which are then positioned in order to include the components 4.

In both cases, temporary holding of the components of the support 21 is accomplished by means of the adherent layer 22 deposited on the support 21 (FIG. 4E). This layer 22 is preferably capable of withstanding the subsequent heat treatment for hardening the resin 6, i.e. its detachment temperature is above that of hardening of the resin 6.

It is then proceeded with filling the free space in each cavity 5 with the coating material 6 (FIG. 4F), for example in the proportions indicated above (the material 6 accounts for less than 30% or 20% by volume of the whole of the final wafer). This material is for example delivered locally with a syringe or else, more coarsely by depositing one or many large drops on the wafer. The penetration of the coating resin into the cavities 5 may be facilitated by applying a vacuum. This filling material 6 is then hardened by heating to a temperature which does not suppress the adherence properties of the film 22.

Figure 4G:
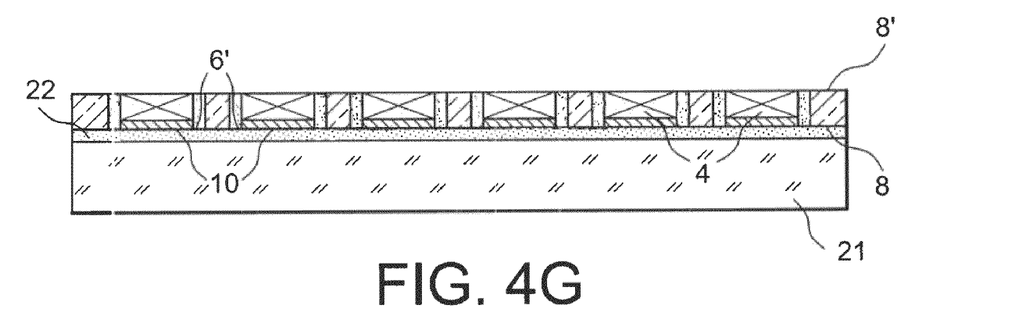

Thinning and polishing of the rear face 8' may then be performed (FIG. 4G).

It is then proceeded with a rise in temperature, in order to exceed the temperature for detaching the layer 22 until the support 21 is detached. At this stage, adhesive layer 22 may remain attached to the wafer 2, at the interfaces of the coating material 6 and of the film 22. These interfaces (areas designated in FIG. 4G by reference 6') form points for residual attachment of the layer 22. Next, it is proceeded with removing the film, here again by a rise in temperature, which leads to the structure of FIG. 1A for example.

It is possible to release the film 22 by insolation through the support 21 if the latter is transparent. This insolation first makes it possible to release the film 22 from the substrate 21. It is then possible to separate the film 22 of the wafer by peeling.

The front face 8 of the obtained component does not have to be processed or treated since it contains the active faces 10 of the components 4.

Next, the wafer may be reintroduced into a line of the micro-electronics type for the <<above IC>> step, for example of the type already described above.

Figure 4H:
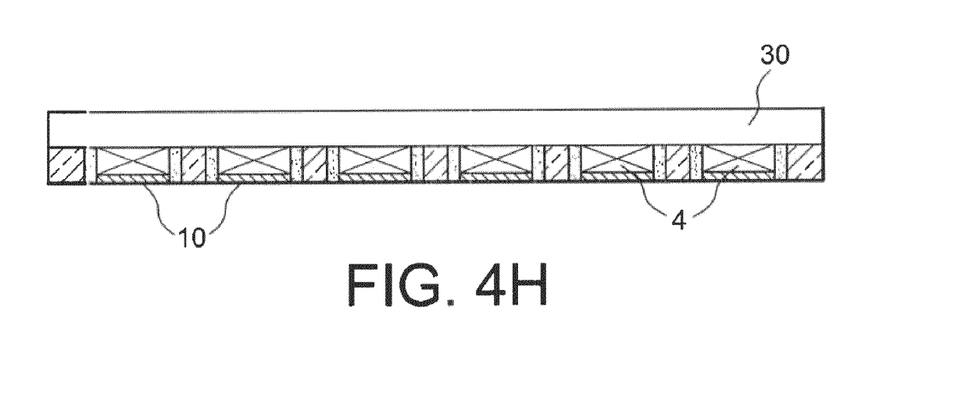

After removing the substrate 21 and the layer 22, the wafer 2 may be adhered onto a second wafer 30 in order to stiffen the assembly (FIG. 4H). The assembly with the second wafer 30 may be performed before removing the substrate 21 and the layer 22.

Generally, the layers 22 in a thermoexpansible material may lose their adhesive properties at various temperatures, for example substantially comprised between 100° C. et 200° C. At a lower temperature, these adhesive properties are retained. These temperatures are compatible with the temperatures for hardening the coating material 6. In other words the hardening of the coating materials starts before the layer 22 loses its adhesive properties: the temperature for hardening the material 6 is below the temperature which causes the layer 22 to lose its adhesive properties. The selection of the exact composition of this layer 22 also depends on the hardening rates of the coating material 6. Indeed, it is sought to have the latter sufficiently hard before the film 22 is detached.

Figure 5A:
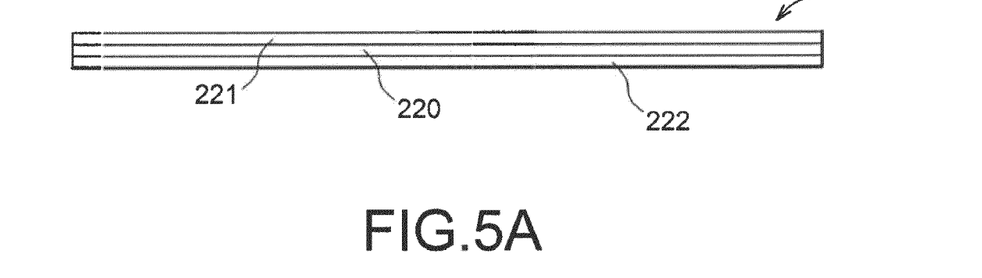
FIGS. 5A and 5B represent an exemplary adhesive layer which may be applied within the scope of the present invention, and a step in which a wafer is assembled with this adhesive layer.

An exemplary adhesive layer 22 which may be advantageously used within the scope of the present invention includes, as illustrated in FIG. 5A, a PET substrate 220 covered on both of its sides with a layer 221, 222 of the thermal release type, or further in a thermoexpansible material, which loses its adhesive properties when it is heated on each side.

The use of this type of layer in the present invention has many advantages, notably the following. In the case when it is first proceeded with detachment of the substrate 21 (the layer 22 therefore remaining temporarily attached to the wafer), and then with that of the wafer (the layer 22 is then separated from the wafer), the PET film 220 between the two layers 221, 222 temporarily ensures sufficient stiffness after separation of the support 21.

Layers of this type are for example made by Haeun Chemitec Co Ltd and marketed as Rexpan.

It may be advantageous to use a film including an adhesive 221, 222, of the thermoexpansible type, different on each side of the substrate 220:

- a first adhesive, for example the adhesive 221, is in contact with the support 21 and is detachable at a first temperature,
- a second adhesive, for example the adhesive 222, is in contact with the wafer 2 and is detachable at a second temperature, above the first. Thus, this adhesive is only detached after hardening of the coating material 6. This is of interest because the hardening time of the coating material 6 is significant. Indeed, when they are heated for too long, the adhesive films tend to become again adherent and are more difficult to remove. In this case, it is advantageous to be able to detach the support 21 although the coating material 6 is not completely hardened.

Figure 5B:
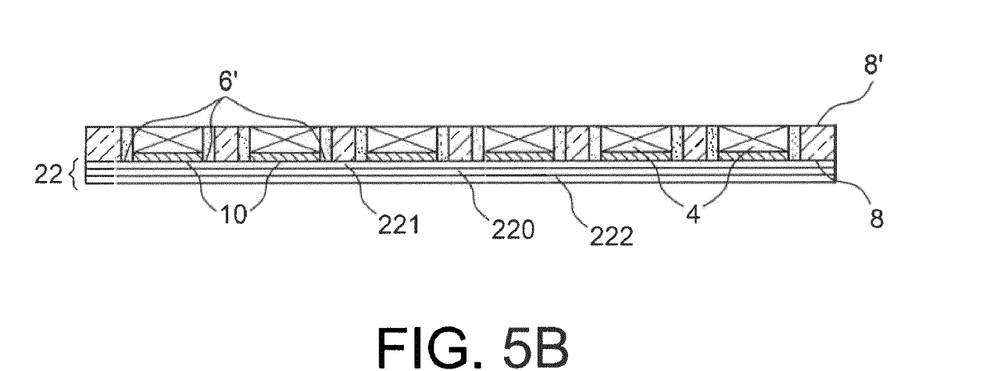

For detaching this type of film at the end of the step of FIG. 4G, it is then proceeded with a rise in temperature until detachment of the support 21 (FIG. 5B). At this stage, the adhesive layer 22 remains attached to the wafer, to the interfaces of the coating material 6 and of the film 22. These interfaces (areas referred to on the FIG. 5B by references 6') form residual attachment points of the layer 22. Stronger mechanical connections, at interface 6' between coating material 6 and adhesive 22, upon hardening, are probably due to penetration of the liquid into the interstices present at the surface of the adhesive and/or to the creation of chemical bonds.

Next, it is also proceeded by a rise in temperature with removal of the film 22 which leads to the structure of FIG. 1A for example.

Another type of adhesive layer 22 which may advantageously be applied within the scope of the present invention, is a thermal wetting resin as those proposed by <<Brewer Science>>.

Figure 6:
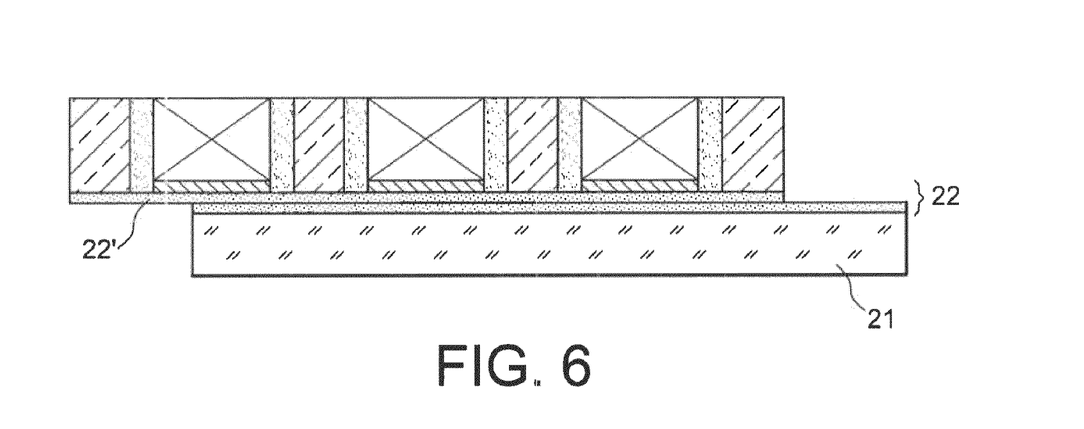
FIG. 6 illustrates the detachment process by sliding during the use of another type of adhesive within the scope of the present invention.

This second type of resin is well adapted to the present invention because it remains hard during the hardening of the coating material and it is thermal wetting, it allows easy separation of the wafer and of the support at high temperatures, for example of about 250° C. for a few minutes, by sliding of the two contacting surfaces, that of the layer 22 and that of the substrate in contact with this surface. This step is illustrated in FIG. 6. In this figure, a portion 22' of the film 22 remains on the wafer 2: these are residues which may be easily cleaned with suitable solvents proposed by resin manufacturers.

Figure 7:
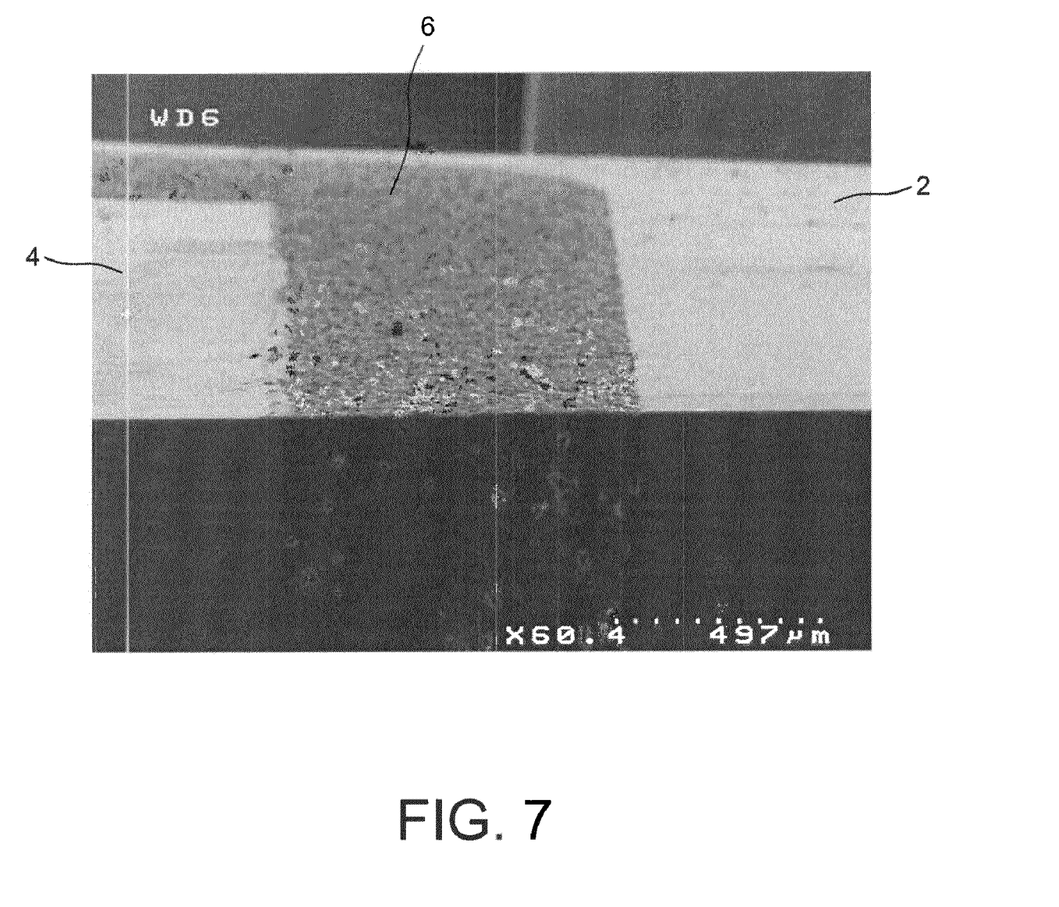
FIG. 7 is an enlarged view of a portion of a device obtained by a method according to the invention.

Both examples of thermoadhesive films 22 proposed above allow integration of the components into wafers with a z flatness tolerance of less than 5 μm. Thus, FIG. 7 is an enlarged view of a portion of a device obtained by a method according to the invention, with a frame portion 2 in Si, of a component 4 in Si and of the coating material 6. This photograph shows the good flatness obtained.

As compared with conventional assembling technologies, the invention integrates components no longer on a wafer (so-called <<Chip-On-Wafer>> technique) but in a wafer 2 (a so-called <<Chip-In-Wafer>> technique). Their exposed active face 10 is in the plane 8 of the polished face of the wafer, which allows them to be reintroduced into a microelectronics line and treatment may be continued by high density <<above-IC>> processes.

Further, a method according to the invention allows mixing of already tested components 4 (<<Known Good Die>>), on different sources and with different thicknesses in a same wafer 2. For example it is possible to integrate components only being used as a conducting passage between both faces of the wafer.

The invention claimed is:

1. A method for integrating discrete components in a wafer, the wafer including cavities capable of receiving the components, the method comprising:
   a) making a stack including a support and a double face thermosensitive adhesive layer, the adhesive layer including two faces, each of which is adhesive and thermosensitive, the wafer and the components positioned in the cavities so that their active faces are in a same plane as a front face of the wafer, the front face being assembled with the layer of double face thermosensitive adhesive;
   b) injecting a material for laterally coating the components into the cavities, a hardening temperature of the material being less than a detachment temperature, above which the double face thermosensitive adhesive layer loses its adhesive properties;
   c) hardening the material for laterally coating the components by heating to a temperature that does not suppress adherence properties of the double face thermosensitive adhesive layer; and
   d) removing at least one of the support and of one portion of the double face thermosensitive adhesive layer.

2. The method according to claim 1, further comprising preliminarily forming an electrically insulating layer on at least one portion of the surfaces of the wafer.

3. The method according to claim 1, wherein the making a) includes:
   a1) a preliminary assembly of the adhesive layer with the wafer, and then an assembly of the support with the adhesive layer, the components being positioned on the adhesive layer before or after assembling the wafer with the adhesive layer;
   a'1) or a preliminary assembly of the adhesive layer with the support, and then an assembly of the wafer with the adhesive layer, the components being positioned on the adhesive before or after assembling the wafer with the adhesive layer.

4. The method according to claim 1, further comprising thinning the rear face of the receiving wafer.

5. The method according to claim 1, further comprising, before or after the injecting b), assembling the wafer with a stiffening substrate.

6. The method according to claim 1, at least one portion of the cavities passing through the wafer over a whole of its thickness and opening out on each of its faces.

7. The method according to claim 1, the wafer further including at least one component or one pattern.

8. The method according to claim 1, the material of the wafer having a heat expansion coefficient comprised between 2 ppm/° C. and 7 ppm/° C.

9. The method according to claim 1, the lateral coating material having a final volume of less than 30% of the volume of the whole of the wafer.

10. The method according to claim 1, the thermosensitive adhesive layer being:
    of a type including a PET layer covered on each side with a film of thermo-expansible material which loses its adhesive properties when it is heated,
    or of a thermal wetting type, separation of the support and of the front face of the wafer being obtained by sliding the layer.

11. The method according to claim 10, the thermosensitive adhesive layer being of the type including a PET layer covered on each side with a film of thermo-expansible material which loses its adhesive properties when it is heated, both films of thermo-expansible material having detachment temperatures different from each other.

12. The method according to claim 1, at least one of the adhesive layer and the support being transparent.

13. An electronic device integrated with discrete components, comprising:
    a wafer including cavities containing the components, an active face of the components being in a same plane as a front face of the wafer;
    a material laterally coating the components in the cavities;
    an adhesive layer in a double face thermosensitive material, the adhesive layer including two faces, each of which is adhesive and thermosensitive, on a side of which are attached the front face of the wafer and the active faces of the components, a support being possibly attached on the other side, a hardening temperature of the material laterally coating the components in the cavities being less than a detachment temperature, above which the double face thermosensitive adhesive layer loses its adhesive properties.

14. The electronic device according to claim 13, the thermosensitive adhesive layer being:
of a type including a PET layer covered on each side with a film of thermo-expansible material which loses its adhesive properties when it is heated,
or of a thermal wetting type, separation of the support and of the front face of the wafer being obtained by sliding the layer.

15. The electronic device according to claim 14, the thermosensitive adhesive layer being of the type including a PET layer covered on each side with a film of thermo-expansible material which loses its adhesive properties when it is heated, both films of thermo-expansible material having detachment temperatures different from each other.

16. The electronic device according to claim 13, at least one of the adhesive layer and the support being transparent.

17. An electronic device integrated with discrete components, comprising:
a wafer including having cavities containing the components, an active face of the components being in a same plane as a front face of the wafer;
a material laterally coating the components in the cavities;
an adhesive layer in a double face thermosensitive material, the adhesive layer including two faces, each of which is adhesive and thermosensitive, on a side of which are attached the front face of the wafer and the active faces of the components, a support being possibly attached on the other side, a hardening temperature of said material laterally coating the components in the cavities being less than a detachment temperature, above which the double face thermosensitive adhesive layer loses its adhesive properties, the thermosensitive adhesive layer being selected from:
a type including a PET layer covered on each side with a film of thermo-expansible material which loses its adhesive properties when it is heated,
or a thermal wetting type, separation of the support and of the front face of the wafer being obtained by sliding the layer.

18. The electronic device according to claim 17, the thermosensitive adhesive layer being of the type including a PET layer covered on each side with a film of thermo-expansible material which loses its adhesive properties when it is heated, both films of thermo-expansible material having detachment temperatures different from each other.

* * * * *